United States Patent
Choi et al.

(10) Patent No.: US 6,404,693 B1
(45) Date of Patent: Jun. 11, 2002

(54) INTEGRATED CIRCUIT MEMORY DEVICES THAT SELECT SUB-ARRAY BLOCKS AND INPUT/OUTPUT LINE PAIRS BASED ON INPUT/OUTPUT BANDWIDTH, AND METHODS OF CONTROLLING SAME

(75) Inventors: Jong-hyun Choi; Dong-il Seo, both of Kyungki-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/634,393

(22) Filed: Aug. 9, 2000

(30) Foreign Application Priority Data

Sep. 9, 1999 (KR) .............................. 99-32584
Jul. 7, 2000 (KR) .............................. 00-38838

(51) Int. Cl.$^7$ ................................ G11C 8/00
(52) U.S. Cl. ................ 365/230.03; 365/230.06
(58) Field of Search ............. 365/230.03, 230.06, 365/238.5

(56) References Cited

U.S. PATENT DOCUMENTS 5,701,271 A * 12/1997 Lee ..................... 365/230.02
6,144,220 A * 11/2000 Young ..................... 326/41

* cited by examiner

Primary Examiner—A. Zarabian
(74) Attorney, Agent, or Firm—Myers Bigel Sibley & Sajovec

(57) ABSTRACT

Integrated circuit memory devices include a memory cell block that includes sub-array blocks and a first number of input/output line pairs adjacent each of a pair of opposing sides of each of the sub-array blocks. A circuit is configured to select one of the sub-array blocks and to input/output the first number of bits of data through the first number of input/output line pairs adjacent each of the pair of opposing sides of the selected one of the sub-array blocks. The circuit is further configured to select a second number of the sub-array blocks and to input/output the first number times the second number of bits of data through the first number of input/output line pairs adjacent each of a pair of opposing sides of the selected second number of the sub-array blocks. Accordingly, the number of input/output lines need not increase even when the bandwidth increases.

4 Claims, 7 Drawing Sheets

INTEGRATED CIRCUIT MEMORY DEVICES THAT SELECT SUB-ARRAY BLOCKS AND INPUT/OUTPUT LINE PAIRS BASED ON INPUT/OUTPUT BANDWIDTH, AND METHODS OF CONTROLLING SAME

FIELD OF THE INVENTION

The present invention relates to integrated circuit memory devices and operating methods therefor, and more particularly to controlling selection of memory sub-array blocks during data input/output.

BACKGROUND OF THE INVENTION

Integrated circuit memory devices are widely used in consumer and industrial applications. In general, memory devices include memory cell array blocks comprising a plurality of memory cells, peripheral circuits for controlling the memory cell array blocks and for writing and/or reading data to/from the memory cells. As the capacity of memory devices becomes larger and memory devices become more highly integrated, the area of the memory cell array blocks may become larger. As a result, the area of the integrated circuit may increase.

In particular, in a Dynamic Random Access Memory (DRAM), the memory cell array blocks are generally divided into a plurality of sub-array blocks, and bit line sense amplifiers, column select transistors, bit line equalizing transistors, isolation transistors, and/or input/output lines are arranged in each of the sub-array blocks. These elements are well known to those skilled in the art and need not be described further herein.

In conventional DRAM structures, the number of input/output lines may be determined by the number of bits of data to be simultaneously written and/or read, that is, by the desired bandwidth. Accordingly, in conventional DRAM structures, when increasing the bandwidth, the number of the input/output lines may increase. As a result, the area of the memory cell array blocks may increase, so that the area of the integrated circuit may increase.

SUMMARY OF THE INVENTION

Integrated circuit memory devices according to embodiments of the invention include a memory cell block comprising a plurality of sub-array blocks and a first plurality of input/output line pairs adjacent each of a pair of opposing sides of each of the sub-array blocks. A circuit is configured to select one of the sub-array blocks and to input/output the first plurality of bits of data through the first plurality of input/output line pairs adjacent each of the pair of opposing sides of the selected one of the sub-array blocks. The circuit is further configured to select the second plurality of the sub-array blocks that is greater than one and to input/output the first plurality times the second plurality of bits of data through the first plurality of input/output line pairs adjacent each of a pair of opposing sides of the selected second plurality of the sub-array blocks. The second plurality preferably is an even integer. Accordingly, the number of input/output lines need not increase even when the bandwidth increases.

Other embodiments of integrated circuit memory devices include a memory. cell array block comprising a plurality of sub-array blocks and a number N (where N is an integer) of input/output line pairs arranged on the right and left sides of each of the sub-array blocks. A row decoder circuit selects one of the sub-array blocks in response to a predetermined row address when the bandwidth is 2N bits, and selects two of the sub-array blocks in response to the predetermined row address when the bandwidth is 4N bits. Moreover, 2N bits of data are input/output through 2N input/output line pairs arranged on both sides of one selected sub-array block when the bandwidth is 2N bits, and 4N bits of data are input/output through 4N input/output line pairs arranged on the right and left sides of two selected sub-array blocks when the bandwidth is 4N bits.

In embodiments of the invention, the row decoder circuit includes an input/output select signal generator, a first pre-decoder, a second pre-decoder and a main decoder.

The input/output select signal generator generates an input/output select signal which is activated when the bandwidth is 4N bits. The first row pre-decoder receives the row address, pre-decodes it, and one bit of block select bits of the row address is ignored ("don't care") when the input/output select signal is activated. The second row pre-decoder receives output signals from the first row pre-decoder, pre-decodes the output signals, and activates two block select signals when one bit of the block select bits is ignored by the first row pre-decoder and activates one block select signal when one bit of the block select bits is not ignored by the first row pre-decoder. The main decoder receives output signals from the second row pre-decoder, selects two of the sub-array blocks, simultaneously activates two predetermined word lines of the two selected sub-array blocks when two block select signals are activated, and selects one of the sub-array blocks and activates one predetermined word line of the one selected sub-array block when one block select signal is activated.

According to method embodiments of the present invention, the first plurality of bits of data are input/output through the first plurality of input/output line pairs adjacent each of a pair of opposing sides of one of the sub-array blocks in response to selection of the one of the sub-array blocks. The first plurality times a second plurality of bits of data are input/output through the first plurality of input/output line pairs adjacent each of a pair of opposing sides of the second plurality of the sub-array blocks in response to selection of the second plurality of the sub-array blocks, wherein the second plurality is greater than one. The second plurality preferably is an even integer.

According to other method embodiments, methods for controlling a memory cell array block in a memory device are provided. The memory cell array block comprises a plurality of sub-array blocks, and a number N (where N is an integer) of input/output line pairs arranged on the right and left sides of each of the sub-array blocks. One of the sub-array blocks is selected in response to a predetermined row address when the bandwidth is 2N bits. Then, 2N bits of data are input/output through input/output line pairs arranged on the right and left sides of one selected sub-array block. Two of the sub-array blocks are selected in response to the row address when the bandwidth is 4N bits. Then, 4N bits are input or output through 4N input/output line pairs arranged on the right and left sides of two selected sub-array blocks.

In other embodiments, the step of selecting one of the sub-array blocks comprises the steps of deactivating an input/output select signal when the bandwidth is 2N bits; responding to one bit of block select bits of the row address when the input/output select signal is deactivated; activating one block select signal when one bit of the block select bits is responded to; and selecting one of the sub-array blocks and activating a predetermined word line of the selected sub-array block when the block select signal is activated.

In other embodiments, the step of selecting two of the sub-array blocks comprises the steps of activating an input/output select signal when the bandwidth is 4N bits; ignoring one bit of block select bits of the row address when the input/output select signal is activated; activating two block select signals when one bit of the block select bits is not ignored; and selecting two of the sub-array blocks and simultaneously activating two predetermined word lines of two selected sub-array blocks when two block select signals are activated.

DETAILED DESCRIPTION OF PREFERRED EMBODIMENTS

The present invention now will be described more fully hereinafter with reference to the accompanying drawings, in which embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout. It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Figure 1:
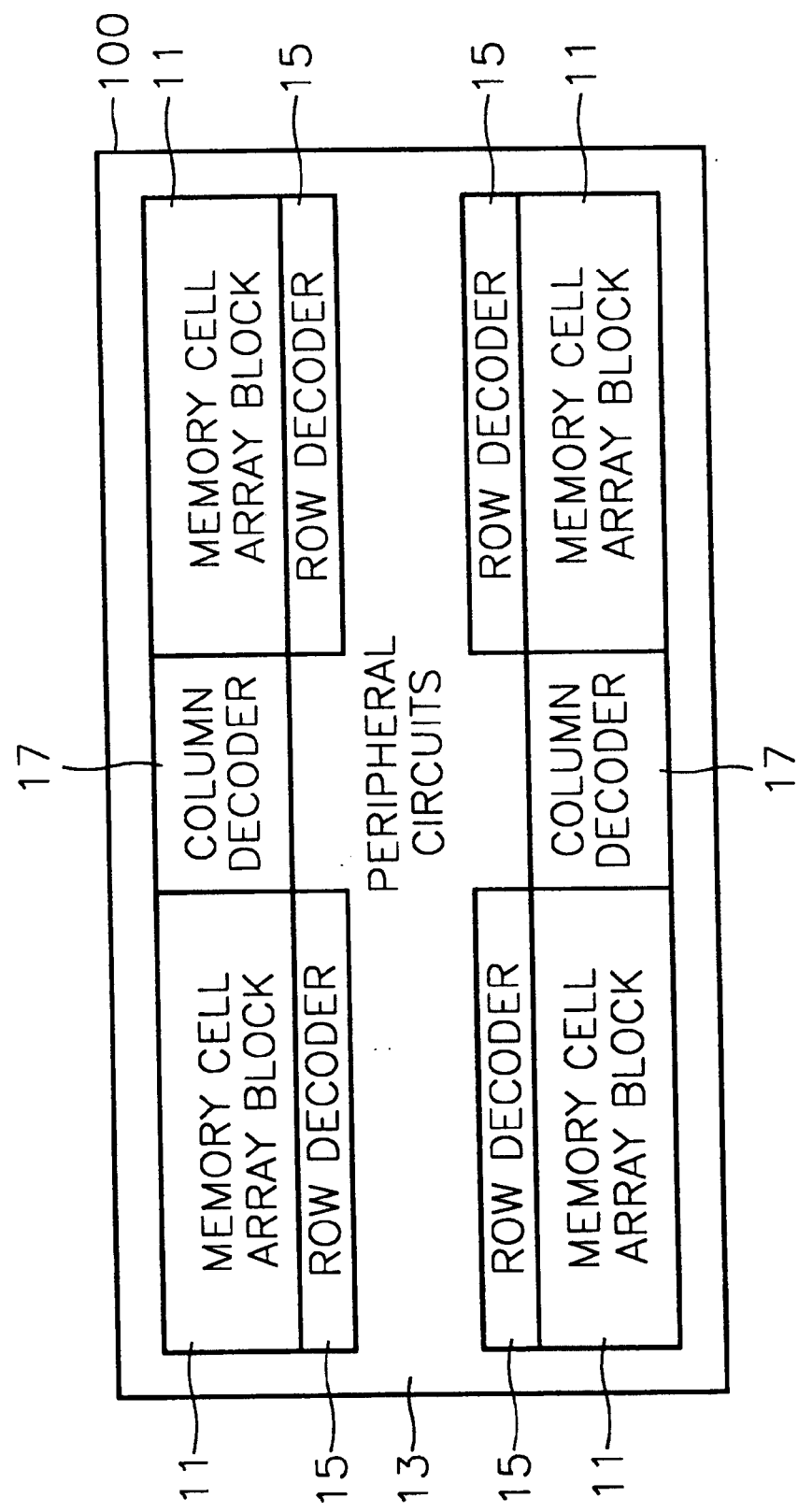
FIG. 1 is a schematic block diagram illustrating a conventional DRAM structure.

Referring to FIG. 1, a conventional integrated circuit memory device 100 includes memory cell array blocks 11 comprising a plurality of memory cells, peripheral circuits 13 for controlling the memory cell array blocks 11 and for writing and/or reading data to and/or from the memory cell array blocks 11, a row decoder 15 for decoding a row address applied from external of the device and for designating the row of the memory cell array blocks 11, and a column decoder 17 for decoding a column address applied from external of the device and for designating the column of the memory cell array blocks 11.

Figure 2:
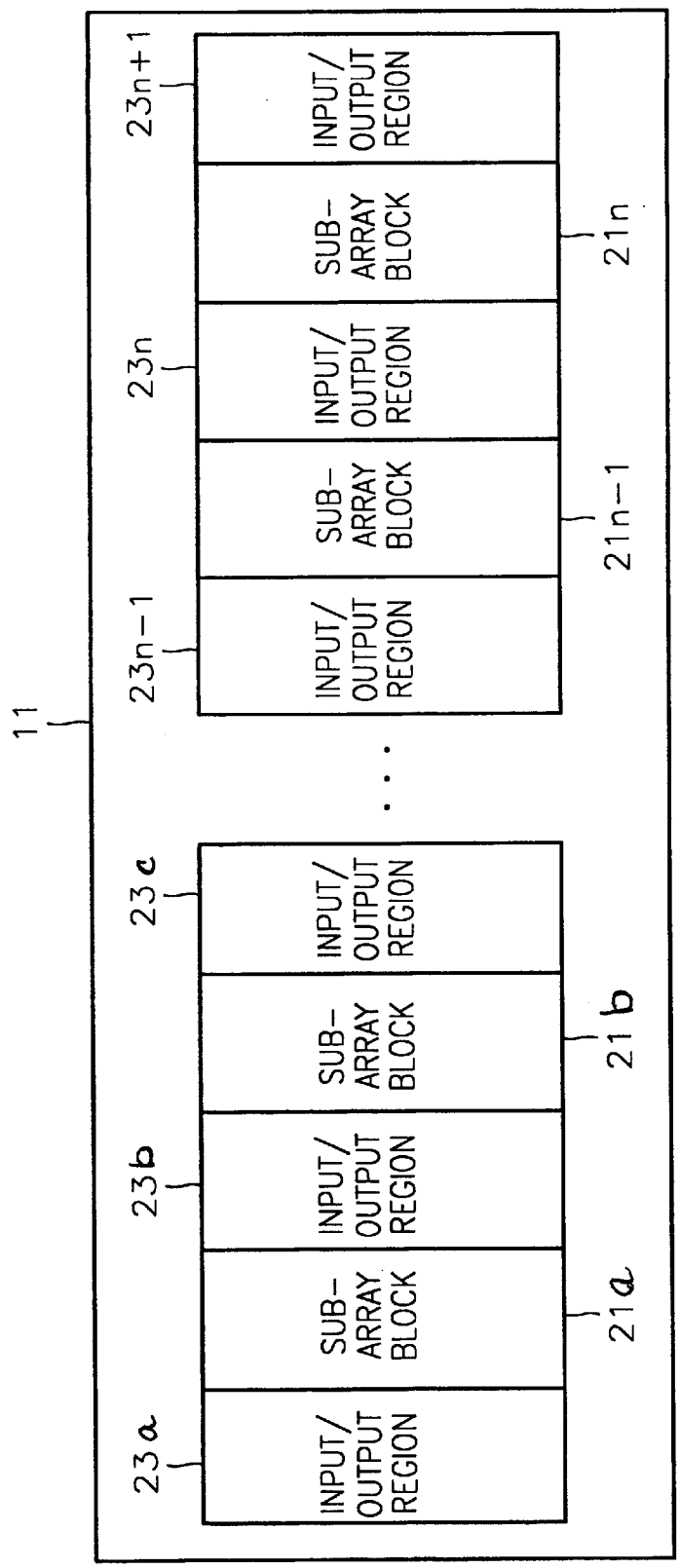
FIG. 2 is a block diagram illustrating a configuration of a memory cell array block shown in FIG. 1.

FIG. 2 is a block diagram illustrating a configuration of a memory cell array block shown in FIG. 1. Referring to FIG. 2, the memory cell array block 11 includes a plurality of sub-array blocks 21a through 21n and input/output regions 23a through 23n+1 between each of the sub-array blocks.

Input/output lines, bit line sense amplifiers, isolation transistor pairs, column select transistors, and/or bit line equalizing transistors (although not shown) are arranged in the input/output regions 23a through 23n. The bit line sense amplifiers amplify a small voltage of bit line pairs which are connected to corresponding memory cells. The isolation transistor pairs are connected between the bit line sense amplifiers, which correspond to the bit line pairs, and the corresponding bit line pairs and bit line sense amplifiers are connected when a corresponding isolation control signal is activated. The column select transistors are connected between the input/output lines, which correspond to the bit line sense amplifiers, and the corresponding bit line sense amplifiers and the corresponding input/output lines are connected when a corresponding column select line is activated. The bit line equalizing transistors equalize the corresponding bit line pairs.

Since the configuration of a memory cell array block, a write operation, and a read operation is well-known to persons skilled in the art, a detailed description thereof need not be provided. For understanding of the invention, the prior art will be further described.

Figure 3:
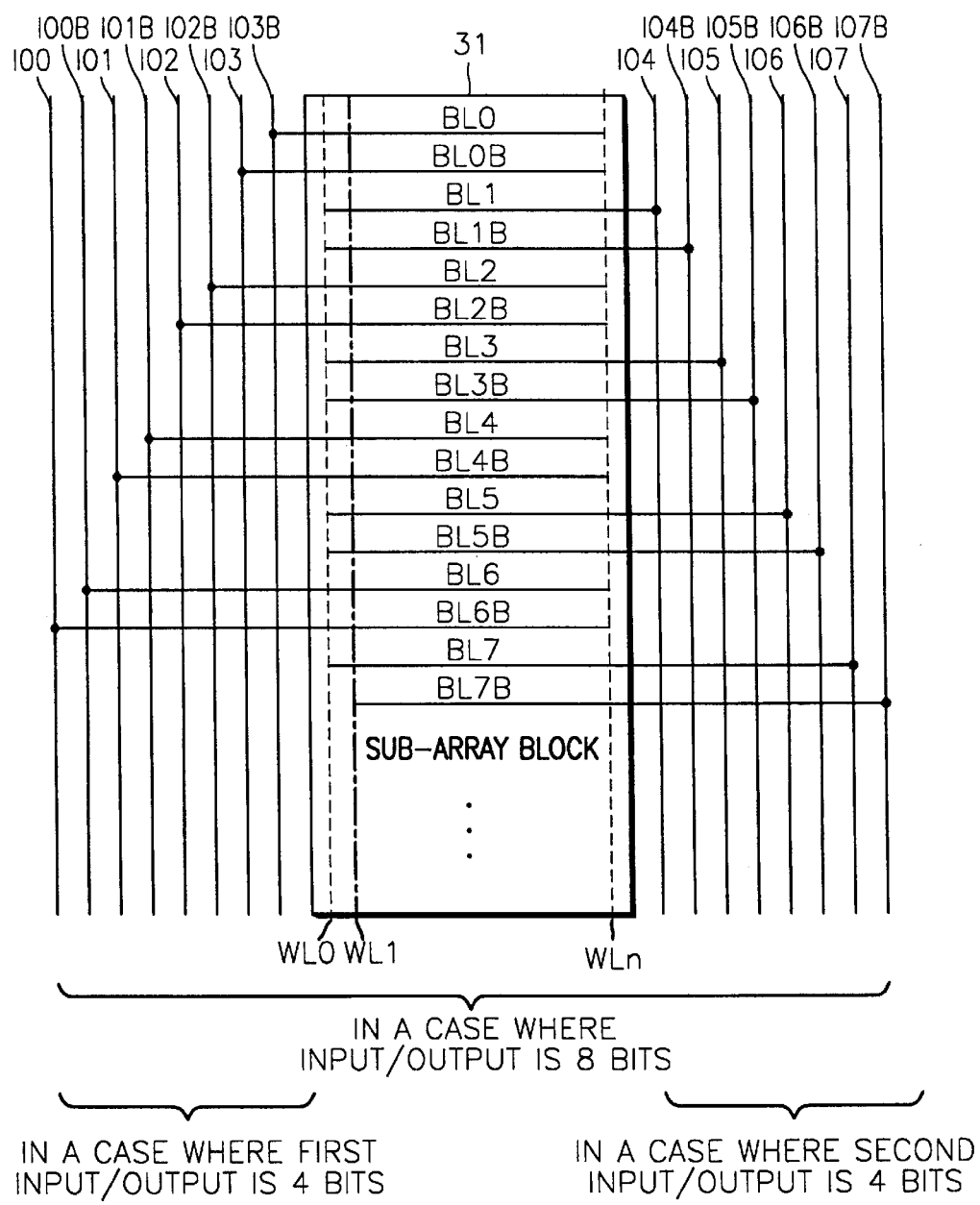
FIG. 3 is a block diagram illustrating a configuration of a sub-array block and an input/output region shown in FIG. 2, when the bandwidth is four bits (X4) and eight bits (X8) according to a prior art.

FIG. 3 is a block diagram illustrating a conventional configuration of a sub-array block and an input/output region shown in FIG. 2 when the number of bits of data to be simultaneously written and/or read, that is, the bandwidth, is four bits (X4) and eight bits (X8).

Referring to FIG. 3, when the bandwidth is four bits (X4) and eight bits (X8), four input/output line pairs are arranged on opposite sides, shown as the right and left sides, of a sub-array block 31, respectively. The sub-array block 31 denotes an arbitrary sub-array block of the sub-array blocks 21a through 21n shown in FIG. 2.

A conventional method for controlling a memory cell array block now will be described with reference to FIG. 3. In a conventional method for controlling a memory cell array block, when the bandwidth is four bits (X4), one of the sub-array blocks 21a through 21n shown in FIG. 2 is selected by a predetermined row address applied from external of the device. In other words, for example, a predetermined word line WL1 of the sub-array block 31, corresponding to one of the sub-array blocks 21a through 21n, is selected and activated by the predetermined row address. Also, column select lines (not shown), which correspond to column addresses, are activated by the column addresses applied from external of the device, and four bit line pairs BL0/BL0B, BL2/BL2B, BL4/BL4B, and BL6/BL6B of four memory cells, which are connected to the word line WL1, are connected to four input/output line pairs IO0/IO0B through IO3/IO3B, which are arranged, for example, on the left side of the sub-array block 31. As a result, the first four bits of data are written to the four memory cells or read from the four memory cells through the four input/output line pairs IO0/IO0B through IO3/IO3B, which are arranged on the left side of the sub-array block 31.

Next, the column select lines (not shown), which correspond to other column addresses, are activated by other column addresses applied from external of the device, and four bit line pairs BL1/BL1B, BL3/BL3B, BL5/BL5B, and BL7/BL7B of the four other memory cells, which are connected to the word line WL1, are connected to four input/output line pairs IO4/IO4B through IO7/IO7B, which are arranged, for example, on the right side of the sub-array block 31. As a result, the second four bits of data are written to the four memory cells or read from the four memory cells through the four input/output line pairs IO4/IO4B through IO7/IO7B, which are arranged on the right side of the sub-array block 31.

Alternatively, when the bandwidth is eight bits (X8), one of the sub-array blocks 21a through 21n shown in FIG. 2 is selected by a predetermined row address applied from external of the device. In other words, for example, a predetermined word line WL1 of the sub-array block 31, corresponding, to one of the sub-array blocks 21a through 21n, is selected and activated by the predetermined row address. Also, column select lines (not shown), which correspond to column addresses, are activated by the column addresses applied from external of the device, and eight bit line pairs BL0/BL0B through BL7/BL7B of eight memory cells, which are connected the word line WL1, are connected to a total of eight input/output line pairs IO0/IO0B through IO7/IO7B, which are arranged on the right and left sides of the sub-array block 31. As a result, eight bits of data are written to the eight memory cells or read from the eight memory cells through the eight input/output line pairs IO0/IO0B through IO7/IO7B, which are arranged on the right and left sides of the sub-array block 31.

When increasing the bandwidth, the number of input/output lines thus may increase. For example, when the bandwidth consists of sixteen bits (X16), eight input/output line pairs may be arranged on the right side of the sub-array block 31 and eight input/output line pairs may be arranged on the left side of the sub-array block 31. As a result, the area of the input/output regions (23a through 23n+1 of FIG. 2) may increase, the area of the memory cell array block (11 of FIG. 2) may increase, and the size of the integrated circuit may increase.

Figure 4:
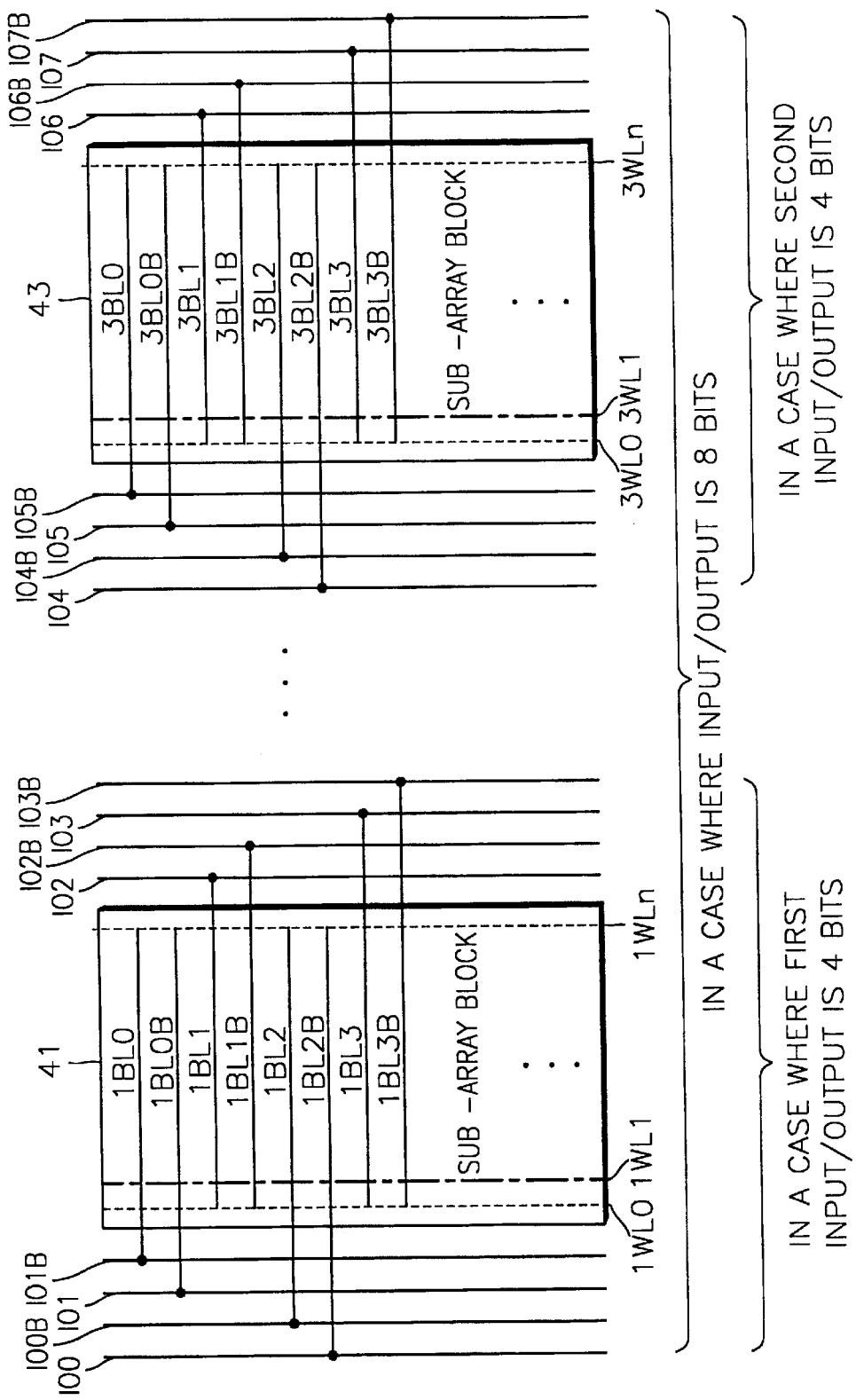
FIG. 4 is a block diagram illustrating memory devices and methods for configuration of a sub-array block and an input/output region shown in FIG. 2 according to embodiments of the present invention, when the bandwidth is four bits (X4) and eight bits (X8)

FIG. 4 is a block diagram illustrating a configuration of the sub-array block and the input/output region shown in FIG. 2 according to embodiments of the present invention when the bandwidth is four bits (X4) and eight bits (X8).

Referring to FIG. 4, when the bandwidth is four bits (X4) and eight bits (X8), two input/output line pairs are arranged, for example, on the right and left sides of sub-array blocks 41 and 43. The sub-array blocks 41 and 43 can denote two arbitrary sub-array blocks of the sub-array blocks 21a through 21n shown in FIG. 2.

Methods for controlling a memory cell array block according to embodiments of the present invention now will be described with reference to FIG. 4. In methods for controlling a memory cell array block according to embodiments of the present invention, when the bandwidth is four bits (X4), one of the sub-array blocks 21a through 21n shown in FIG. 2 is selected by a predetermined row address applied from external of the device. In other words, for example, a predetermined word line 1WL1 of the sub-array block 41, corresponding to one of the sub-array blocks 21a through 21n, is selected and activated by the predetermined row address. Also, column select lines (not shown), which correspond to column addresses, are activated by the column addresses applied from external of the device, and four bit line pairs 1BL0/1BL0B through 1BL3/1BL3B of four memory cells, which are connected to the word line 1WL1, are connected to four input/output line pairs IO0/IO0B through IO3/IO3B, which are arranged on the right and left sides of the sub-array block 41. As a result, the first four bits of data are written to the four memory cells and/or read from the four memory cells through the four input/output line pairs IO0/IO0B through IO3/IO3B, which are arranged, for example, on the right and left sides of the sub-array block 41.

Also, when the bandwidth is four bits (X4), another of the sub-array blocks 21a through 21n shown in FIG. 2 is selected by another predetermined row address applied from external of the device. In other words, for example, a predetermined word line 3WL1 of the sub-array block 43, corresponding to another of the sub-array blocks 21a through 21n, is selected and activated by another predetermined row address. After that, the next four bits of data are written in the four memory cells or read from the four memory cells through the four input/output line pairs IO4/IO4B through IO7/IO7B, which are arranged, for example, on the right and left sides of the sub-array block 43, according to the same procedures as described above.

Alternatively, when the bandwidth is eight bits (X8), the sub-array blocks 41 and 43, corresponding to two of the sub-array blocks 21a through 21n shown in FIG. 2, are selected by a predetermined row address applied from external of the device. In other words, for example, a predetermined word line 1WL1 of the sub-array block 41 and a predetermined word line 3WL1 of the sub-array block 43 are simultaneously selected and activated by the predetermined row address. Also, column select lines (not shown), which correspond to column addresses, are activated by the column addresses applied from external of the device, and four bit line pairs 1BL0/1BL0B through 1BL3/1BL3B of four memory cells, which are connected to the word line 1WL1, are connected to four input/output line pairs IO0/IO0B through IO3/IO3B, which are arranged, for example, on the right and left sides of the sub-array block 41, and four bit line pairs 3BL0/3BL0B through 3BL3/3BL3B of four memory cells, which are connected to the word line 3WL1, are connected to four input/output line pairs IO4/IO4B through IO7/IO7B, which are arranged, for example, on the right and left sides of the sub-array block 43. As a result, eight bits of data are written to the eight memory cells or read from the eight memory cells through the eight input/output line pairs IO0/IO0B through IO7/IO7B.

Also, when the bandwidth is sixteen bits (X16), four of the sub-array blocks 21a through 21n shown in FIG. 2 are selected by a predetermined row address applied from external of the device. According to the above-mentioned procedures, data are written in four memory cells per sub-array block, that is, in sixteen memory cells, and read from the sixteen memory cells.

Figure 5:
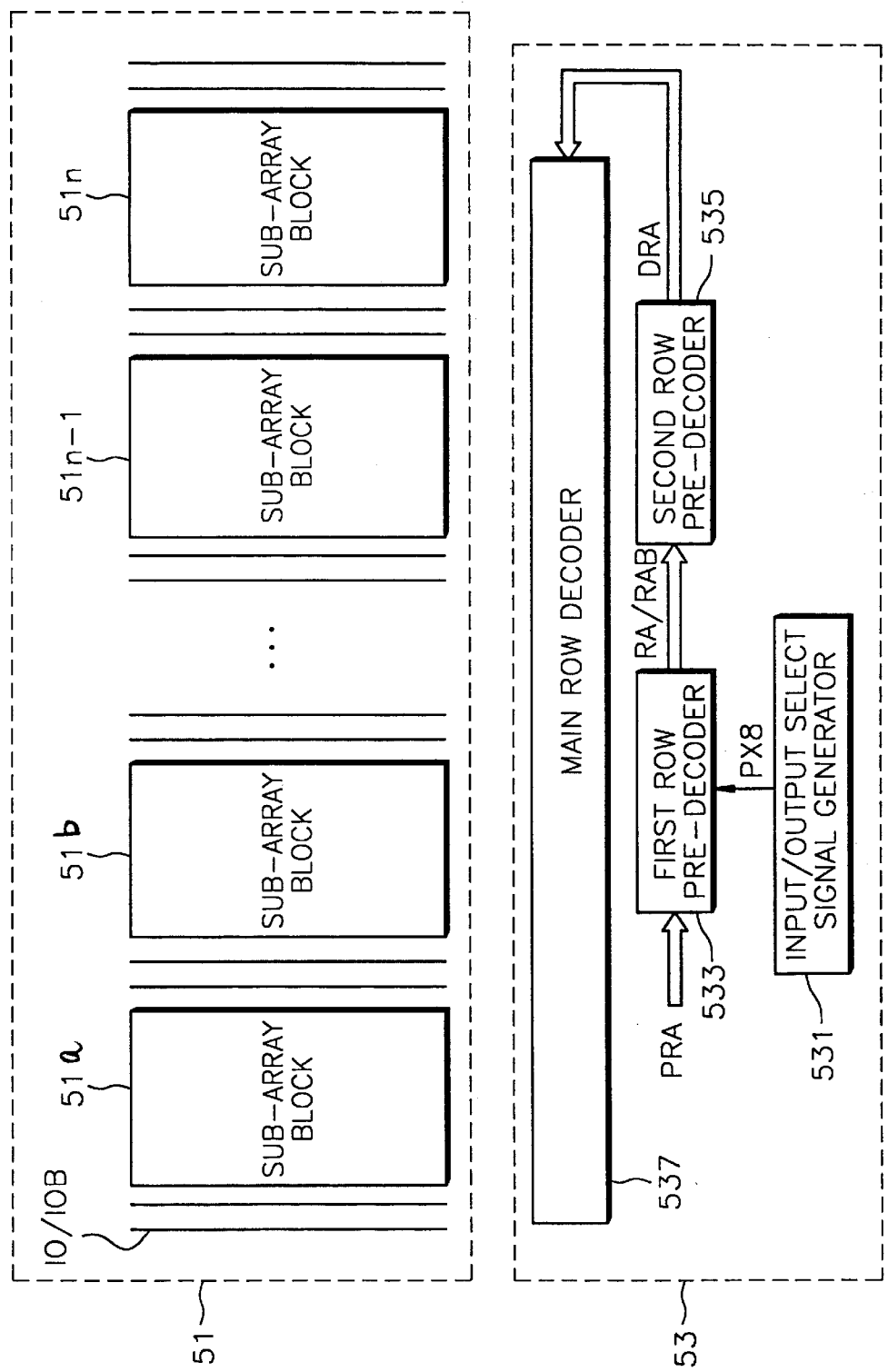
FIG. 5 is a block diagram of a memory devices and methods according to other embodiments of the present invention.

FIG. 5 is a block diagram of memory devices and methods according to embodiments of the present invention, in which a memory cell array block is controlled according to embodiments of the present invention. Here, only blocks related to the embodiments of the present invention are shown.

Referring to FIG. 5, memory devices and methods according to embodiments of the present invention include a memory cell array block 51 comprising a plurality of sub-array blocks 51a through 51n, two input/output line pairs IO/IOB arranged, for example, on the right and left sides of each of the sub-array blocks, and a row decoder circuit 53. Here, two input/output line pairs IO/IOB are arranged, for example, on the right and left sides of each of the sub-array blocks, but can be arranged in multiples of two as desired.

The row decoder circuit 53 selects one of the sub-array blocks 51a through 51n in response to a predetermined row address PRA applied from external of the device when the bandwidth is four bits and selects two of the sub-array blocks 51a through 51n in response to the predetermined row address PRA when the bandwidth is eight bits. As a result, four bits of data are input/output through four input/output line pairs arranged, for example, on the right and left sides of one selected sub-array block when the bandwidth is four bits, and eight bits of data are input/output through eight input/output line pairs arranged, for example, on the right and left sides of two selected sub-array blocks when the bandwidth is eight bits.

In greater detail, an embodiment of the row decoder circuit 53 includes an input/output select signal generator 531, a first row pre-decoder 533, a second row pre-decoder 535, and a main row decoder 537. The input/output select signal generator 531 generates an input/output select signal PX8 which is activated when the bandwidth is eight bits. The first row pre-decoder 533 receives the row address PRA from external of the device through an address buffer (not shown) and pre-decodes the row address PRA. In particular, the first row pre-decoder 533 ignores ("don't care") an uppermost bit of the row address PRA when the input/output select signal PX8 is activated, that is, when the bandwidth is eight bits. The uppermost bit of the row address PRA corresponds to one bit of block select bits for selecting the sub-array blocks 51a through 51n.

The second row pre-decoder 535 receives output signals of the first row pre-decoder 533, that is, first pre-decoded address signals, and pre-decodes the signals and generates a second pre-decoded address signal DRA comprising block select signals. In particular, the second row pre-decoder 535 activates two block select signals to select two of the sub-array blocks 51a through 51n when the uppermost bit of the row address PRA is ignored by the first row pre-decoder 533, that is, when the bandwidth is eight bits. Also, the second row pre-decoder 535 activates one block select signal to select one of the sub-array blocks 51a through 51n when the uppermost bit of the row address PRA is not ignored by the first row pre-decoder 533, that is, when the bandwidth is four bits.

The main decoder 537 receives an output signal of the second row pre-decoder 535, that is, the second pre-decoded address signal DRA. Here, the main decoder 537 selects two of the sub-array blocks 51a through 51n when two block select signals are activated, when the bandwidth is eight bits, and selects and simultaneously activates one predetermined word line of one selected sub-array block and another predetermined word line of another selected sub-array block.

As described above, column select lines (not shown), which correspond to the column addresses, are activated by the column addresses applied from external of the device through a path (not shown), and four bit line pairs of four memory cells, which are connected to the word line in one selected sub-array block, are connected to four input/output line pairs, which are arranged on the opposite sides (e.g., right and left sides) of one selected sub-array block. Also, the four bit line pairs of the four memory cells, which are connected to the word line in another selected sub-array block, are connected to the four input/output line pairs, which are arranged in the opposite sides (e.g., right and left sides) of another selected sub-array block. As a result, eight bits of data are written to eight memory cells and/or read from the eight memory cells through eight input/out line pairs.

Meanwhile, the main decoder 537 receives an output signal of the second row pre-decoder 535, that is, the second pre-decoded address signal DRA. The main decoder 537 selects one of the sub-array blocks 51a through 51n when one block select signal is activated, when the bandwidth is four bits, and selects and activates one predetermined word line of one selected sub-array block.

As described above, column select lines (not shown), which correspond to the column addresses, are activated by the column addresses applied from external of the device through a path (not shown), and four bit line pairs of four memory cells, which are connected to the word line in one selected sub-array block, are connected to four input/output line pairs, which are arranged on the opposite sides (e.g., right and left sides) of one selected sub-array block. As a result, four bits of data are written to the four memory cells or read from the four memory cells through the four input/out line pairs.

Also, the row decoder circuit 53 can be formed to select four of the sub-array blocks 51a through 51n by the predetermined row address PRA applied from external of the device when the bandwidth is sixteen bits. In this case, data are written to four memory cells per sub-array block, that is, in sixteen memory cells, and/or the data are read from sixteen memory cells.

Accordingly, in methods for controlling a memory cell array block according to embodiments of the present invention and in memory devices according to embodiments of the present invention, the number of input/output lines need not increase even if the bandwidth is increased. As a result, the area of the input/output regions (23a through 23n of FIG. 2), in which the input/output lines are arranged, need not be increased.

Figure 6:
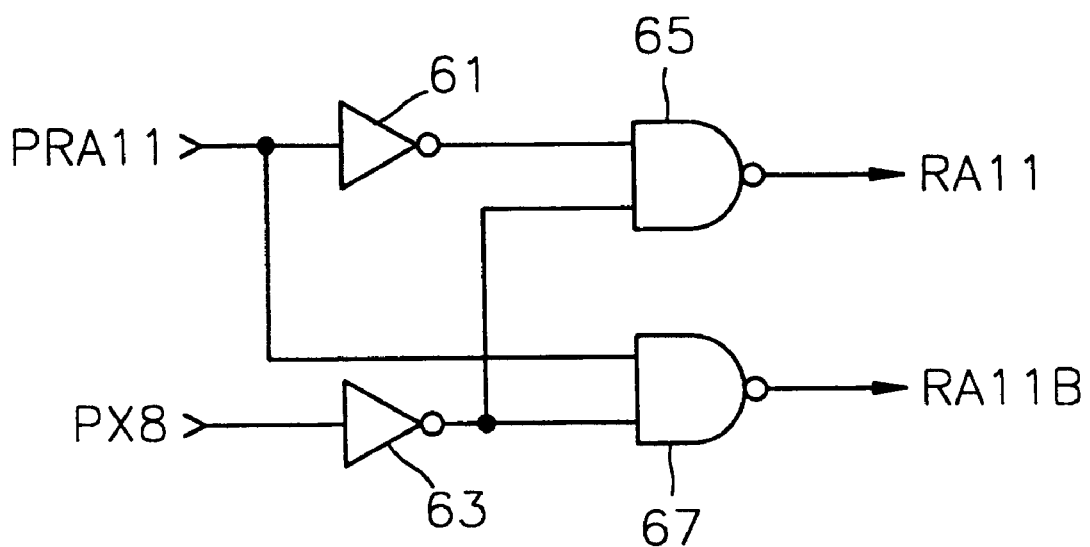
FIG. 6 is a circuit diagram of circuits and methods for decoding an uppermost bit of a row address in a first row pre-decoder shown in FIG. 5.

FIG. 6 is a circuit diagram of an embodiment of a circuit for decoding an uppermost bit of a row address in the first row pre-decoder shown in FIG. 5.

Referring to FIG. 6, the uppermost bit decoder circuit includes inverters 61 and 63, and NAND gates 65 and 67. The uppermost bit decoder circuit ignores an uppermost bit PRA11 of the row address PRA when the input/output select signal PX8 is activated to a logic "high", that is, when the bandwidth is eight bits. The most significant bit PRA11 is one bit of the block select bits. In other words, the uppermost bit decoder circuit activates first pre-decoded signals RA11 and RA11B to a logic "high" regardless of the uppermost bit PRA11 of the row address PRA when the input/output select signal PX8 is activated to a logic "high". RA11B denotes an inverted signal of the signal RA11.

Figure 7:
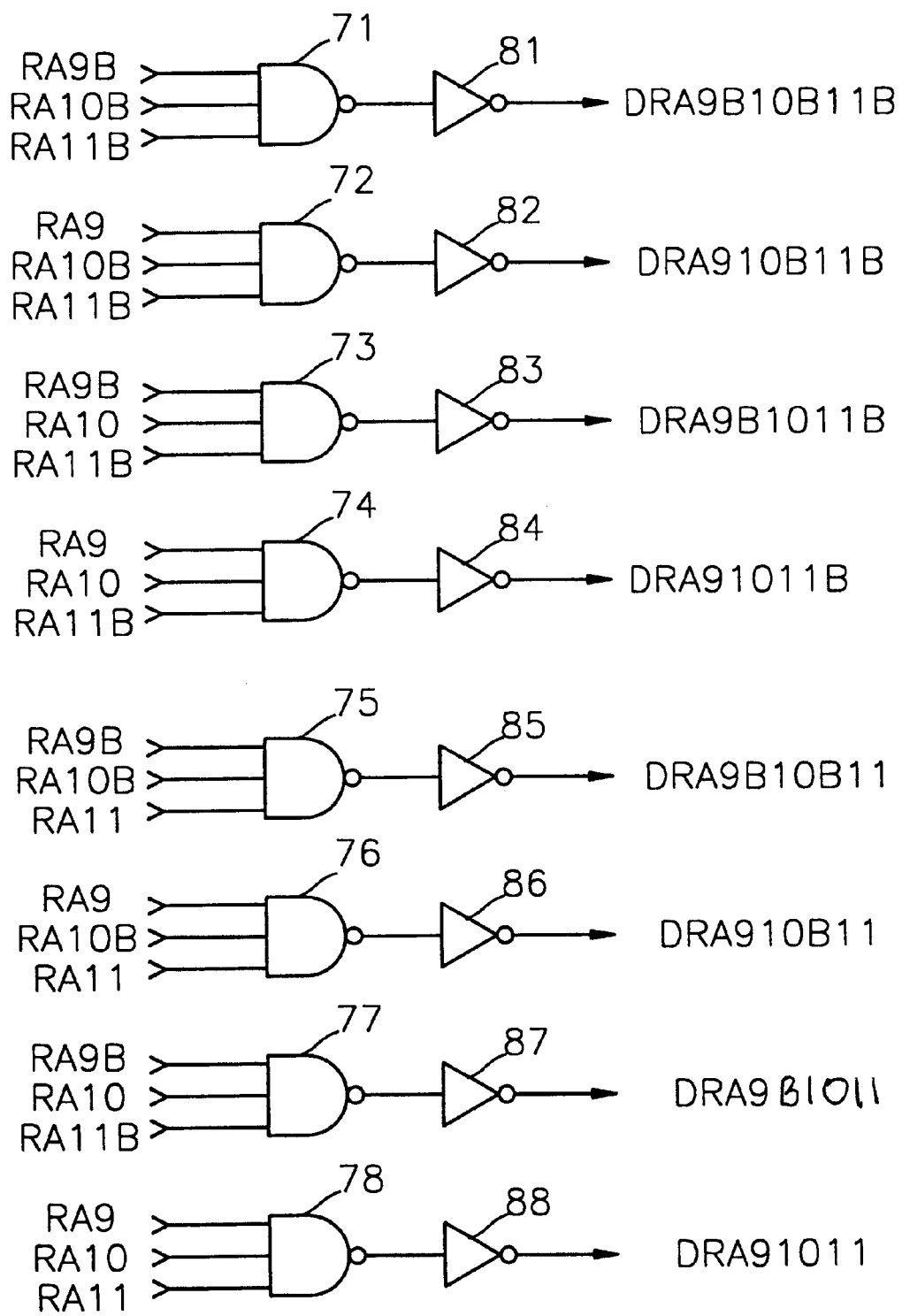
FIG. 7 is a circuit diagram of block select signal generating circuits and methods in a second row pre-decoder shown in FIG. 5.

FIG. 7 is a circuit diagram of an embodiment of a block select signal generating circuit in the second row pre-decoder shown in FIG. 5. Here, an assumption is made that the number of sub-array blocks 51a through 51n shown in FIG. 5 is eight and upper three bits of the row address PRA are block select bits.

Referring to FIG. 7, an embodiment of a block select signal generating circuit includes eight NAND gates 71 through 78, and eight inverters 81 through 88. The block select signal generating circuit receives address signals RA9, RA9B, RA10, RA1OB, RA11, and RA11B, in which the block select bits are first pre-decoded, and then pre-decodes the address signals and generates eight block select signals DRA9B10B11B through DRA91011 for selecting eight sub-array blocks 51a through 51n.

In particular, two block select signals are activated when the uppermost bit PRA11 of the row address PRA, corresponding to one bit of the block select bits, is ignored by the uppermost bit decoder circuit shown in FIG. 6, that is, when address signals RA11 and RA11B are logic "high". For example, two block select signals DRA9B10B11B and DRA9B10B11 are activated to a logic "high" when the address signals RA11 and RA11B are (1, 1) and the address signals RA9B and RA10B are (1, 1).

On the other hand, one block select signal is activated when the uppermost bit PRA11 of the row address PRA is not ignored. For example, only one block select signal DRA9B10B11B is activated to a logic "high" when the address signals RA11 and RA11B are (0, 1), and the address signals RA9B and RA10B are (1, 1).

As described above, in methods for controlling a memory cell array block according to embodiments of the present invention and in memory devices according to embodiments the present invention, the number of sub-array blocks selected by variation of the bandwidth is changed. Therefore, the number of input/output lines need not increase even if the bandwidth is increased. As a result, the area of the input/output regions (23a through 23n of FIG. 2), in which the input/output lines are arranged, need not increase. Accordingly, the area of the memory cell array block need not increase even if the bandwidth is increased, and the area of the integrated circuit need not increase.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. An integrated circuit memory device comprising:
    a memory cell array block comprising a plurality of sub-array blocks;
    an integer number N of input/output line pairs arranged on opposite sides of each of the sub-array blocks; and
    a row decoder circuit that selects one of the sub-array blocks in response to a predetermined row address when the bandwidth of the memory device is 2N bits, and that selects two of the sub-array blocks in response to the predetermined row address when the bandwidth of the memory device is 4N bits;
    wherein 2N bits of data are input/output through 2N input/output line pairs arranged on opposite sides of one selected sub-array block when the bandwidth is 2N bits, and 4N bits of data are input/output through 4N input/output line pairs arranged on opposite sides of two selected sub-array blocks when the bandwidth is 4N bits; and
    wherein the row decoder circuit comprises:
        an input/output select signal generator that generates an input/output select signal which is activated when the bandwidth is 4N bits;
        a first row pre-decoder that receives the row address and pre-decodes the row address, and that ignores one bit of block select bits of the row address when the input/output select signal is activated;
        a second row pre-decoder that receives output signals of the first row pre-decoder and pre-decodes the output signals, and that activates two block select signals when one bit of the block select bits is ignored by the first row pre-decoder, and that activates one block select signal when one bit of the block select bits is not ignored by the first row pre-decoder; and
        a main decoder that receives an output signal of the second row pre-decoder, that selects two of the sub-array blocks and simultaneously activates two predetermined word lines of the two selected sub-array blocks when two block select signals are activated, and that selects one of the sub-array blocks and activates one predetermined word line of the one selected sub-array block when one block select signal is activated.

2. The memory device according to claim 1, wherein the row decoder circuit selects four of the sub-array blocks in response to the row address and inputs/outputs 8N bits of data through 8N input/output line pairs arranged on the opposite sides of the four selected sub-array blocks when the bandwidth is 8N bits.

3. A method for controlling a memory cell array block in an integrated circuit memory device comprising a memory cell array block that includes a plurality of sub-array blocks, and an integer number N of input/output line pairs arranged on the opposite sides of each of the sub-array blocks, the method comprising the steps of:
    selecting one of the sub-array blocks in response to a predetermined row address when the bandwidth of the memory device is 2N bits; then
    inputting or outputting 2N bits of data through 2N input/output line pairs arranged on the opposite sides of one selected sub-array block;
    selecting two of the sub-array blocks in response to the row address when the bandwidth of the memory device is 4N bits; and then
    inputting or outputting 4N bits of data through 4N input/output line pairs arranged on the opposite sides of two selected sub-array blocks;
    wherein the step of selecting one of the sub-array blocks comprises the steps of:
        deactivating an input/output select signal when the bandwidth is 2N bits;
        responding to one bit of block select bits of the row address when the input/output select signal is deactivated;
        activating one block select signal when one bit of the block select bits is responded to; and
        selecting one of the sub-array blocks and activating a predetermined word line of the selected sub-array block when the block select signal is activated; and
    wherein the step of selecting two of the sub-array blocks comprises the steps of:
        activating an input/output select signal when the bandwidth is 4N bits;
        ignoring one bit of block select bits of the row address when the input/output select signal is activated;
        activating two block select signals when one bit of the block select bits is ignored; and
        selecting two of the sub-array blocks and simultaneously activating two predetermined word lines of two selected sub-array blocks when two block select signals are activated.

4. The method for controlling a memory cell array block according to claim 3, further comprising the steps of:
    selecting four of the sub-array blocks in response to the row address when the bandwidth of the memory device is 8N bits; and then
    inputting/outputting 8N bits of data through 8N input/output line pairs arranged on the opposite sides of four selected sub-array blocks.

* * * * *